(12) United States Patent
Little et al.

(10) Patent No.: US 9,318,853 B2
(45) Date of Patent: *Apr. 19, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Stephen Sedio, Valley Center, CA (US); Chun-Yi Chang, New Taipei (TW); Chih-Pi Cheng, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 86 days.

This patent is subject to a terminal disclaimer.

(21) Appl. No.: 14/337,180

(22) Filed: Jul. 21, 2014

(65) Prior Publication Data
US 2015/0024612 A1    Jan. 22, 2015

Related U.S. Application Data

(60) Provisional application No. 61/856,077, filed on Jul. 19, 2013, provisional application No. 61/857,687, filed on Jul. 23, 2013.

(51) Int. Cl.
*H01R 24/00* (2011.01)
*H01R 13/66* (2006.01)
*H05K 1/11* (2006.01)

(52) U.S. Cl.
CPC ............ *H01R 13/6658* (2013.01); *H05K 1/117* (2013.01)

(58) Field of Classification Search
CPC ................... H01R 23/7073; H01R 23/7005
USPC .................. 439/660, 626, 374, 377, 79, 733
See application file for complete search history.

(56) References Cited

U.S. PATENT DOCUMENTS

| 6,755,689 | B2 * | 6/2004 | Zhang | H01R 12/716 439/357 |
| 8,087,944 | B2 * | 1/2012 | Kumamoto | H01R 12/716 439/108 |
| 8,517,773 | B2 * | 8/2013 | Lee | H01R 12/722 439/660 |
| 8,968,031 | B2 | 3/2015 | Simmel et al. | |
| 2013/0095702 | A1 | 4/2013 | Golko et al. | |
| 2015/0024612 | A1 * | 1/2015 | Little | H05K 1/02 439/55 |
| 2015/0044886 | A1 * | 2/2015 | Little | H01R 12/75 439/55 |
| 2015/0072562 | A1 * | 3/2015 | Little | H01R 13/6658 439/607.55 |
| 2015/0126069 | A1 * | 5/2015 | Little | H01R 13/6581 439/607.55 |
| 2015/0162684 | A1 | 6/2015 | Amini et al. | |
| 2015/0171562 | A1 | 6/2015 | Gao et al. | |
| 2015/0171573 | A1 * | 6/2015 | Little | H01R 24/60 439/607.34 |
| 2015/0214673 | A1 | 7/2015 | Gao et al. | |
| 2015/0214674 | A1 | 7/2015 | Simmel et al. | |

FOREIGN PATENT DOCUMENTS

TW     M454654     6/2013

* cited by examiner

*Primary Examiner* — Phuongchi T Nguyen
(74) *Attorney, Agent, or Firm* — Wei Te Chung; Ming Chieh Chang

(57) ABSTRACT

A plug connector includes a connector tab connected to and extending longitudinally away from a rear body, the tab includes opposite first and second major surfaces. A first plurality of contacts is carried by the tab on the first major surface and a second plurality of contacts is carried by the tab on the second major surface. The contacts include differential signal pairs. Each pair of the differential signal pairs is consisting of two individual contacts and said two contacts are located adjacent to each other but at the first and second main surface respectively.

9 Claims, 17 Drawing Sheets

| Potential 24 pin assignment for interstitial design | | | | | | | | | | | |
|---|---|---|---|---|---|---|---|---|---|---|---|
| CC1 | GND | D+ | RX1+ | VBUS | TX1+ | GND | TX2+ | GND | RX2+ | D- | VBUS |
| VBUS | D- | RX1- | GND | TX1- | GND | TX2- | VBUS | RX2- | D+ | GND | CC2 |

FIG. 9

| USB WG PDR 24pin assignment | | | | | | | |
|---|---|---|---|---|---|---|---|
| CC1 | TX2+ | GND | TX1+ | VBUS | D+ | D- | GND | RX1- | GND | RX2- | VBUS |
| VBUS | RX2+ | GND | RX1+ | GND | D- | D+ | VBUS | TX1- | GND | TX2- | CC2 |

FIG. 10

| G | TX+ | TX− | G | D+ | CC1 | D− | VBUS | RX− | RX+ | VBUS |
|---|---|---|---|---|---|---|---|---|---|---|
| VBUS | RX+ | RX− | VBUS | D− | | D+ | G | TX− | TX+ | G |

FIG. 15

FLIPPABLE ELECTRICAL CONNECTOR

BACKGROUND OF THE INVENTION

1. Field of the Invention

The present invention relates to an electrical connector, and more particularly to an external plug connector.

2. Description of Related Art

US Patent Publication No. 20130095702A1 discloses a dual orientation plug connector, which has a connector tab with first and second major opposing sides and a plurality of electrical contacts carried by the connector tab. The plurality of contacts may include a first set of external contacts formed at the first major side and a second set of external contacts formed at the second major side. The first plurality of contacts may be symmetrically spaced with the second plurality of contacts and the connector tab may be shaped to have 180 degree symmetry so that it can be inserted and operatively coupled to a corresponding receptacle connector in either of two insertion orientations.

A receptacle connector corresponds to the plug connector. A sensing circuit in the receptacle or the electronic device in which the receptacle connector is housed can detect the orientation of the contacts and switch internal connections to the contacts in the connector jack as appropriate. When the contacts are more, the sensing circuit is more complicated, which will waste software switches or hardware switches.

Hence, a new and simple electrical connector is desired.

SUMMARY OF THE INVENTION

Accordingly, the object of the present invention is to provide a flappable plug connector.

In order to achieve the above-mentioned object, a plug connector comprises a connector tab connected to and extending longitudinally away from a rear body, the tab includes opposite first and second major surfaces. A first plurality of contacts is carried by the tab on the first major surface and a second plurality of contacts is carried by the tab on the second major surface. The contacts comprise differential signal pairs. Each pair of the differential signal pairs is consisting of two individual contacts and said two contacts are located adjacent to each other but at the first and second main surface respectively.

Other objects, advantages and novel features of the invention will become more apparent from the following detailed description when taken in conjunction with the accompanying drawings.

BRIEF DESCRIPTION OF THE DRAWINGS

FIG. 9 is a pin assignment of the plug connector as shown in FIG. 8;

FIG. 10 is a pin assignment of a plug connector of a related other's design;

FIG. 15 is a perspective view of a plug connector with a first orientation and a corresponding receptacle connector according to a forth embodiment of the present invention;

DETAILED DESCRIPTION OF THE PREFERRED EMBODIMENT

Reference will now be made in detail to the preferred embodiment of the present invention.

Figure 1:
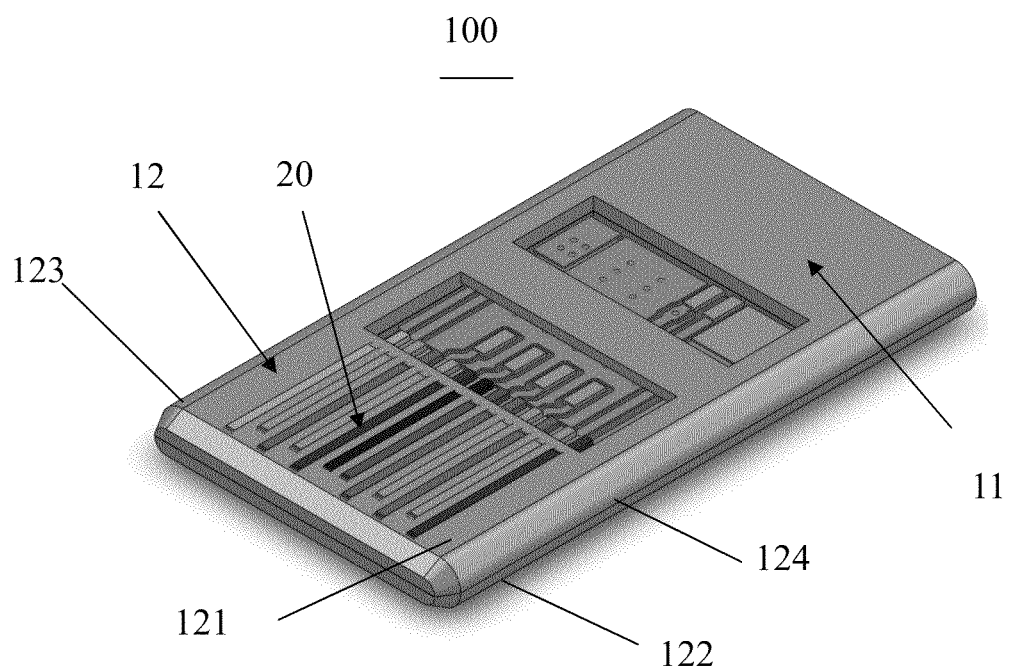
FIG. 1 is a front and top perspective view of a plug connector in accordance with a first embodiment of the present invention.
Figure 4:
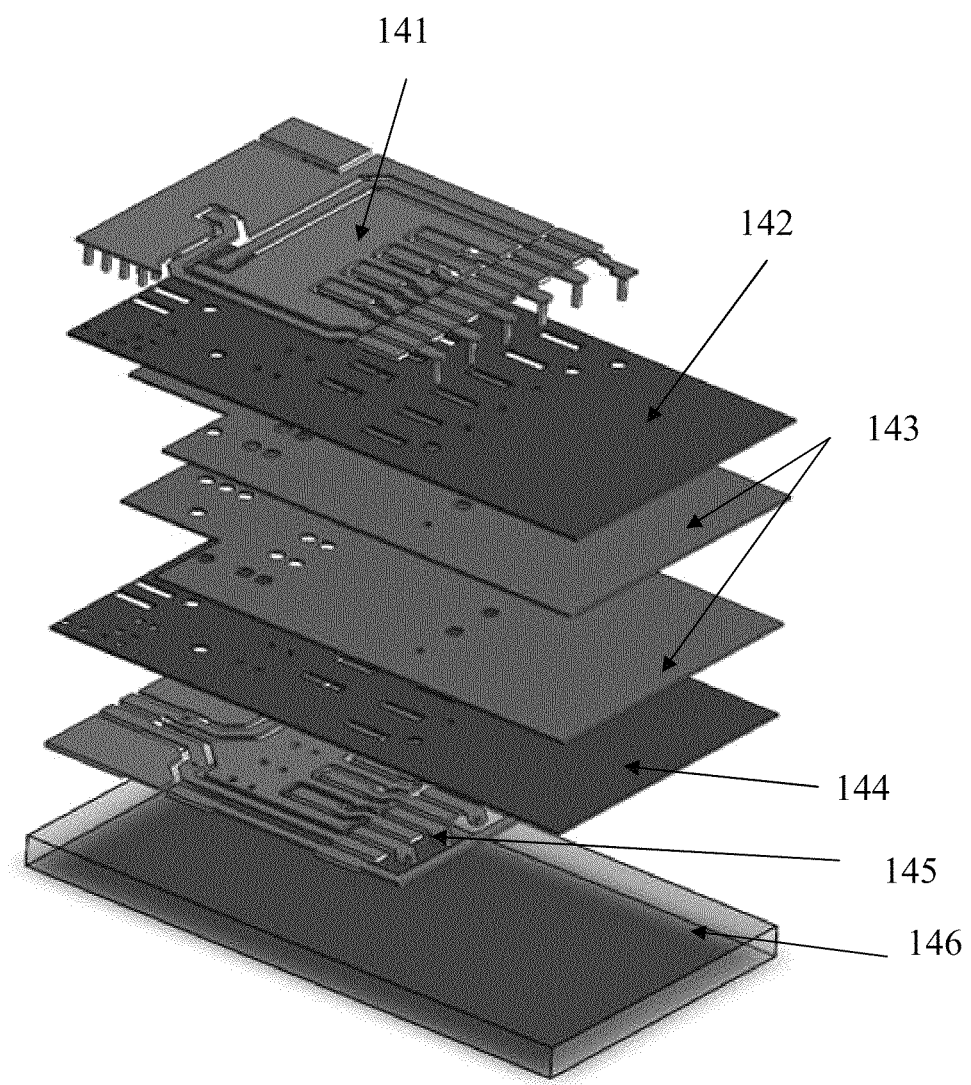
FIG. 4 is an exploded perspective view of the PCB shown in FIG. 3.

Referring to FIGS. 1 and 4 showing a first embodiment of a flappable plug connector 100 which has a split plug housing with an internal grounding printed circuit board (PCB), according to the present invention. The plug connector 100 is adapted for connecting with a cable or a movable device, the plug connector as shown in FIG. 1 is shown in a board base, a front portion of the board base is functioned as a connector tab 12 embedded with plate contacts 20, which extends out of and longitudinally away from a rear portion or a body 11. An insulating frame (not shown) will be attached at the base 11 so that the wholly base 11 can be wider and/or thicker than the tab 12, but in other embodiments, the connector tab 12 and the body 11 have essentially the same width and thickness. Said plate contacts 20 are positioned on a first major surface/upper main surface 121 and a second main surface 122 of the plug connector. The connector tab 12 also includes two side surfaces 123, 124 that are substantially thinner than first and second major surfaces 121, 122 and extend between the first and second major surfaces. The side surfaces 123, 124 and the front end of the tab 12 are shaped in an arc for easy insertion to a receptacle connector.

The contacts 20 are external contacts and the plug connector 100 does not include an exposed cavity in which particles and debris may collect. To improve robustness and reliability, the plug connector 100 may be fully sealed and include no moving parts. The plug connector 100 is designed with a dual orientation design so that the plug connector 100 can be inserted into the corresponding receptacle connector. In such embodiments, the connector tab 12 is not polarized and designed with 180 degree symmetry outline, that means two halves of the connector tab 12 are same no matter the connector tab 12 are bisected along a centre horizontal plane or along a centre vertical plane.

The plug connector 100 includes an upper half housing 13a, a lower half housing 13b and an internal PCB 14. Said two half housing are symmetry.

Figure 2:
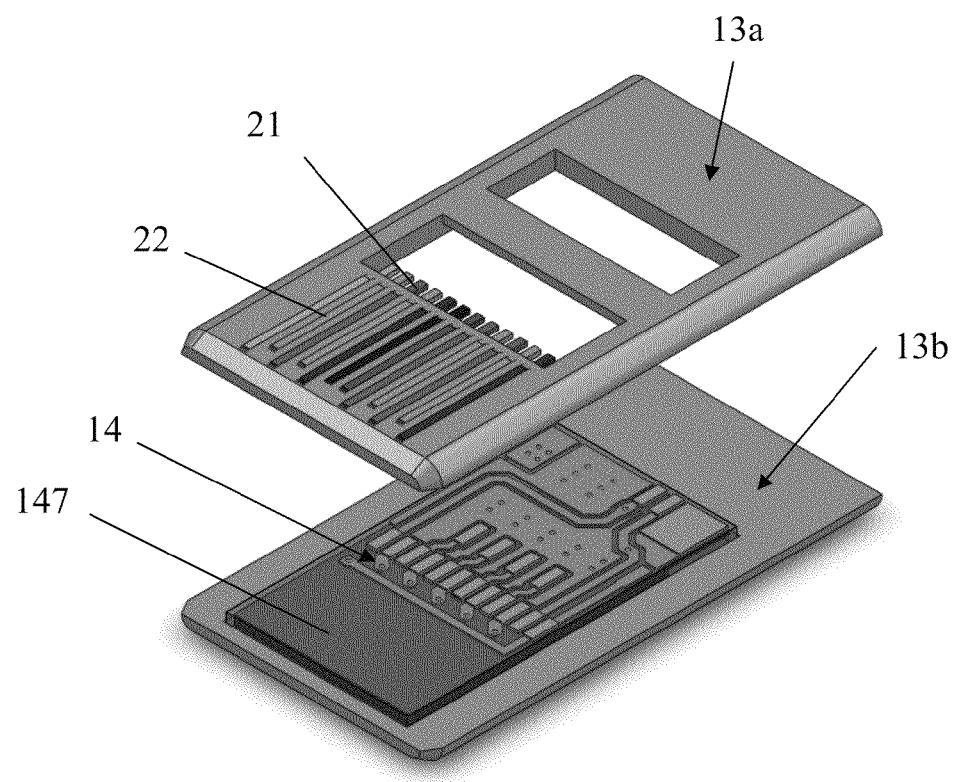
FIG. 2 is an exploded perspective view of the plug connector shown in FIG. 1.

The PCB 14 is a multi-layer PCB, which has a top layer 141, a first ground layer 142, two V-BUS layers 143 and a second ground layer 144, a bottom layer 145 and a base substrate 146 from a top to bottom in order. The top and bottom lays 141, 145 are conductive pad layers, which have a plurality contacting pads 1411 located near to a middle portion of the layers. The first ground layer 142 is disposed between the top layer 141 and one V-BUS layer 143 and the second ground layer 144 is disposed between the bottom layer 145 and the other V-BUS layer 143. Please notes, the two ground layers 142, 144 extend rearwards so as to be between the top layer and the bottom layer, the two ground layers extending forward between the V-BUS layer and beyond the contacting pads 1411. As best shown in FIG. 2, the PCB 14 is clipped between said two half housings, the front portion 147 of PCB is just located between the plate contacts 2 so that the contacts on opposite main surfaces is shielding from each other since there are ground layers in the PCB. The legs 21 of the plate contacts 20 curve in the opening and electrical connecting with the conductive pads 1411 of the PCB 14. The plate contacting portions 22 of the plug connects 20 are disposed on opposite main surfaces of the connector tab.

Figure 3:
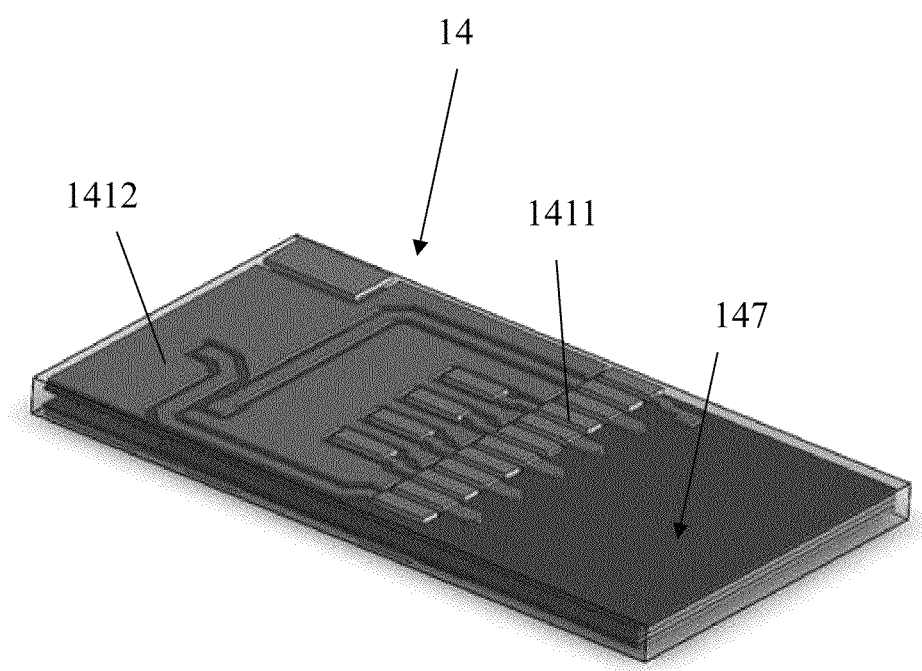
FIG. 3 is a front top view of a PCB shown in FIG. 2.
Figure 5:
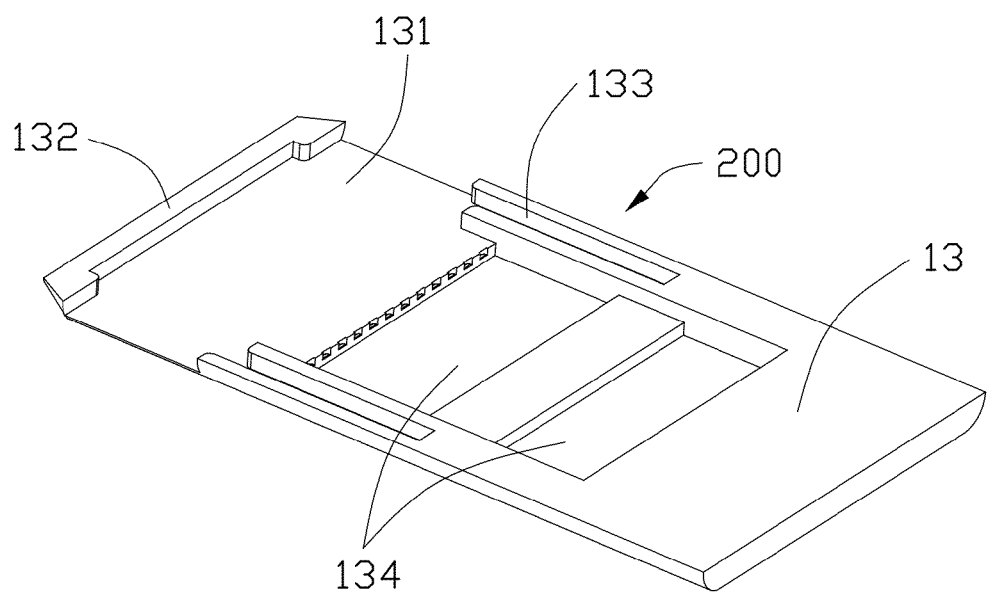
FIG. 5 is a perspective view of a lower half housing in an another embodiment of a plug connector according to the present invention.
Figure 6:
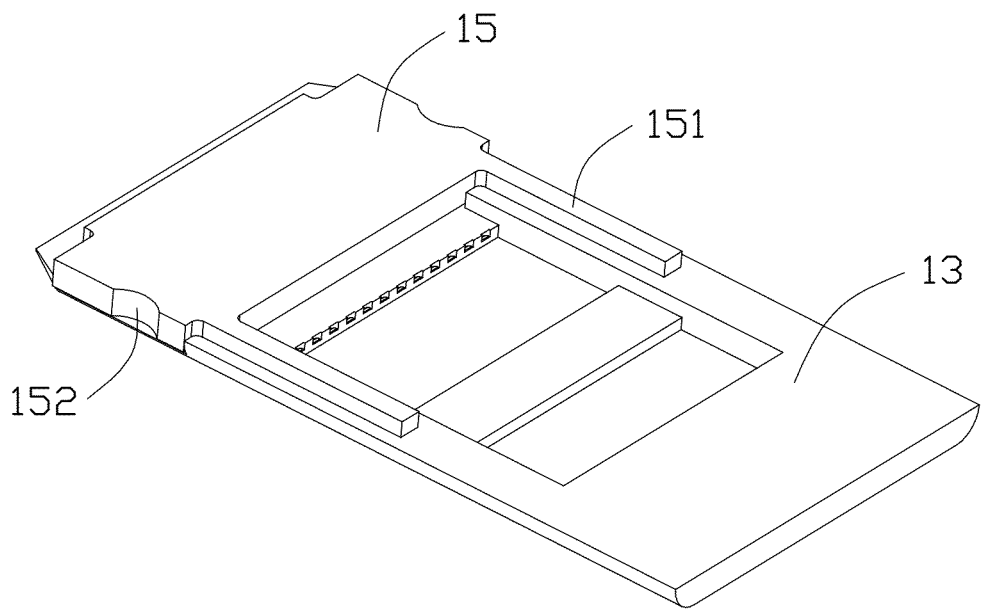
FIG. 6 is a perspective view of the lower half housing with a metal plate.
Figure 7:
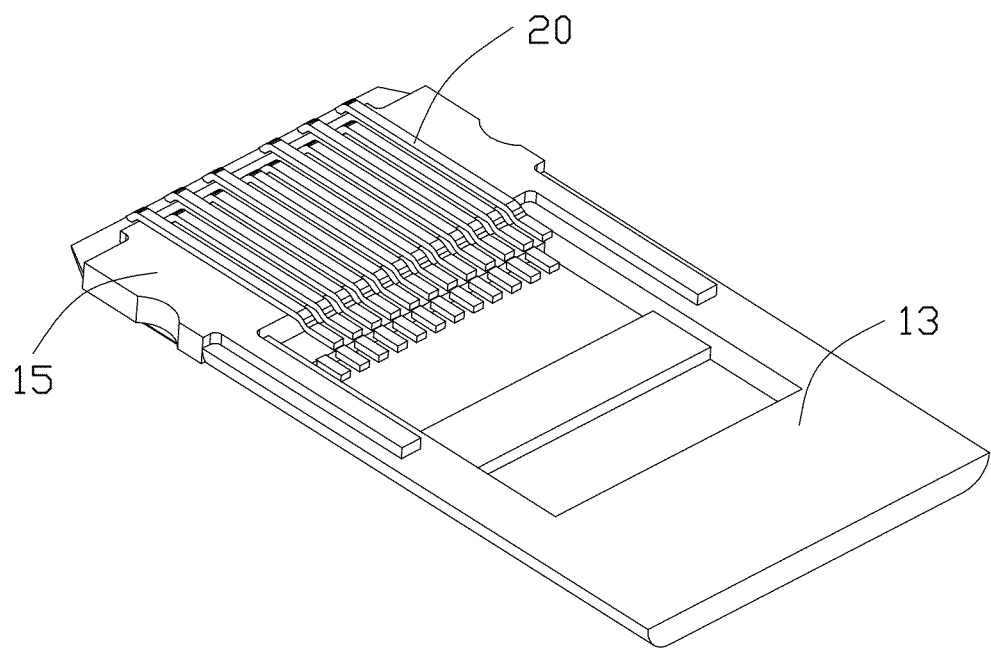
FIG. 7 is a perspective view of the lower half housing with the metal plate and two rows contacts, wherein the insulating portion of the upper half housing is removed to show the upper contacts.

FIGS. 5 through 7 illustrate an another embodiment of a plug connector 200 which is similar to the plug connector 100. The front grounding portion 147 in the plug connector 100 is replaced with a metal plate 15 for strength and reduce cross-talking. The half housing 13 is formed with a recessed room 131 at front portion thereof with front stop rib 132, two forward extending slots 133 at opposite sides thereof which communicate with the recessed room. Two rectangle opening 134 are defined at the rear portion thereof. The centre metal plate 15 is disposed in the recessed room 131 with two rearward ribs 151 are retained in the slots 133. The metal plate 15 is limited by the front stop rib 132 and the slots in the longitudinal direction of the plug connector, which will enhance strength of the tab 12. The metal plate 15 can also have side latching element 152 in a shape of notch. The metal plate 15 is higher than the rear portion of the half housing 13, which is predetermined to dispose a PCB (not shown) which also is a multi-layer PCB similar to FIG. 3. Please notes, the PCB has no front ground portion, the metal plate is functioned as a ground plane to reduce cross-talk between the contacts 20. The metal plate 15 also can add some bard features thereon to interfere with the upper and lower half housing for housing assembly.

Figure 8:
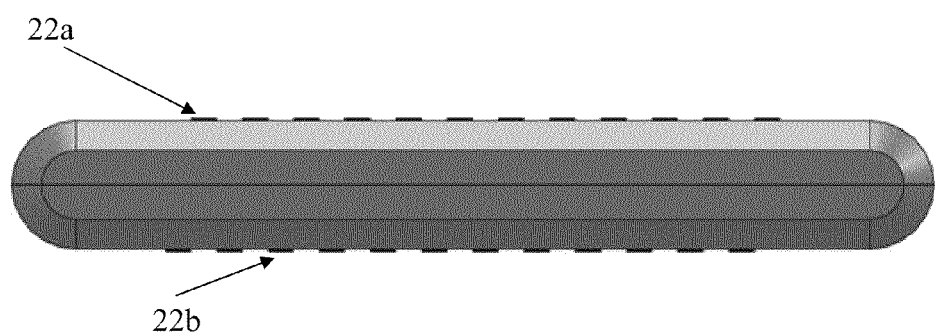
FIG. 8 is a schematic front view of the plug connector as shown in FIG. 1.

As shown in FIG. 8, a front side view of the connector tab 12 shown in FIG. 1 is shown. The contacting portions 22 are disposed on upper main surface and a lower main surface of the connector tab. The upper contacting portions 22a are offset from the lower contacting portions 22b, and the upper contacting portion 22a is located between a gap of two lower contacting portions 22b in the thickness direction viewed from a top view.

FIG. 9 illustrates a pin assignment of the connector tab shown in FIG. 8. A differential signal pair of the contacts which usually is located adjacent to each other, is split to be disposed on opposite main surfaces, such as (RX1+, RX1−), (TX1+, TX1−), (RX2+, RX2−), (TX2+, TX2−), which can be used to transmit USB 3.0 signal together with two contacts (D+, D−) to transmit USB 2.0. The two contacts of each differential signal pair are located adjacent to each other even through the contacts 20 are located on opposite main surfaces. In FIG. 10, the upper contacting portions and the lower contacting portions are aligned with each other, and the two contacts of each differential signal pair are located at the upper main surface and the lower main surface while in a symmetrical manner relative to a centerline of the tab.

Figure 11:
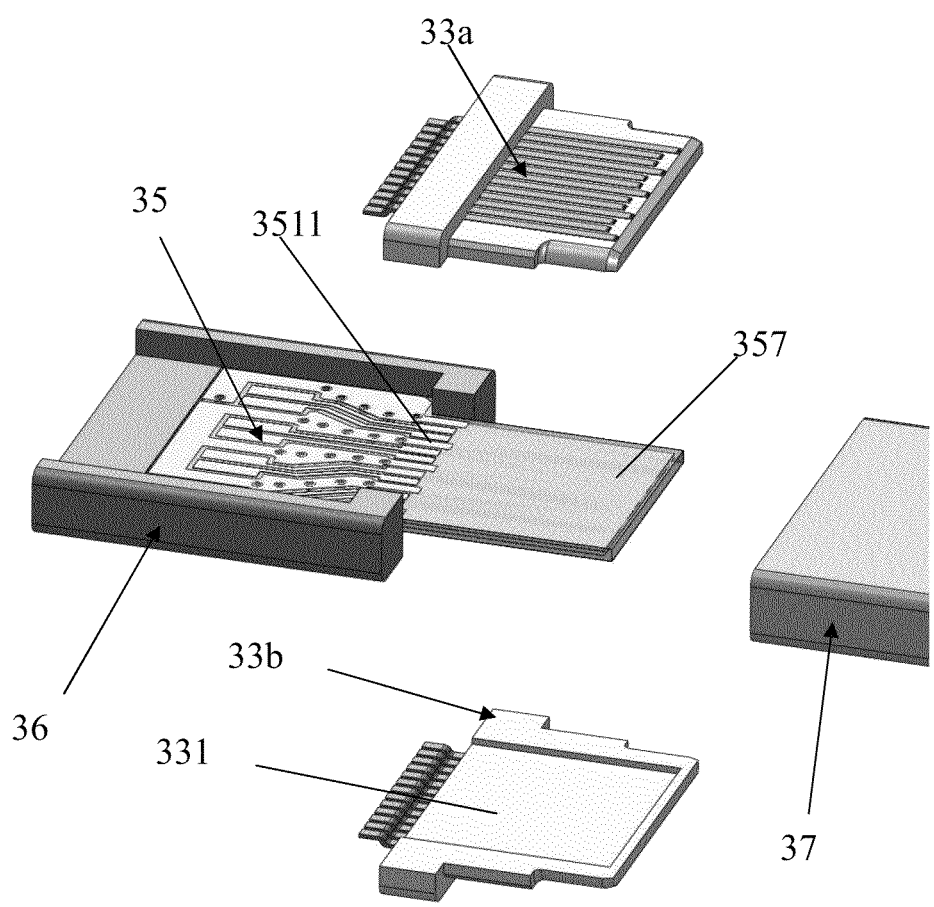
FIG. 11 is an exploded perspective view of a plug connector of a second embodiment according to the present invention.
Figure 12:
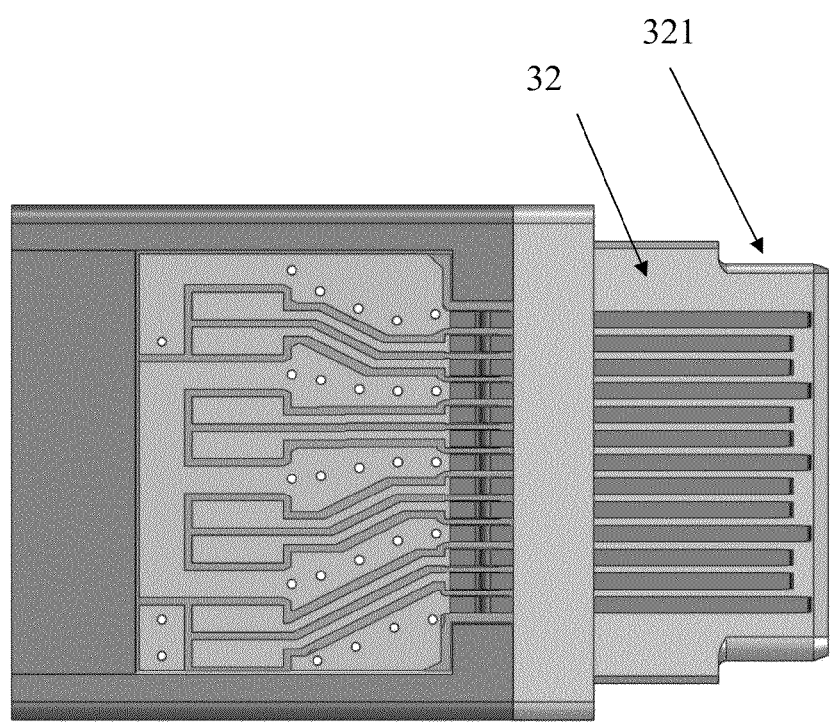
FIG. 12 is a perspective view of the plug connector as shown in FIG. 11.

FIGS. 11 to 12 illustrate a second embodiment of a plug connector 300 according to this present invention. The electrical connector 300 includes an upper half housing 33a and a lower half housing 33b loaded with plug contacts. The legs of the contacts extend out of the half housing and the contacting portions of the contacts are disposed along the upper and lower main surface of the half portions. The PCB 35 are disposed in an insulating frame 36 with conductive pads 3511 defined on the PCB are located near to a front entrance of the insulative frame 36 so that a front ground portion 357 of the PCB projects forward through the entrance. The upper and lower half housing 33a, 33b are attached to opposite side of the front ground portion of the PCB, thereby the upper and lower contacting portions are shielded by the front ground portion of the PCB. An insulating cover 37 is surrounded to the insulating frame 36. The tab 32 of the electrical connector defines two recessed portions 321 at front lateral sides thereof.

Figure 13:
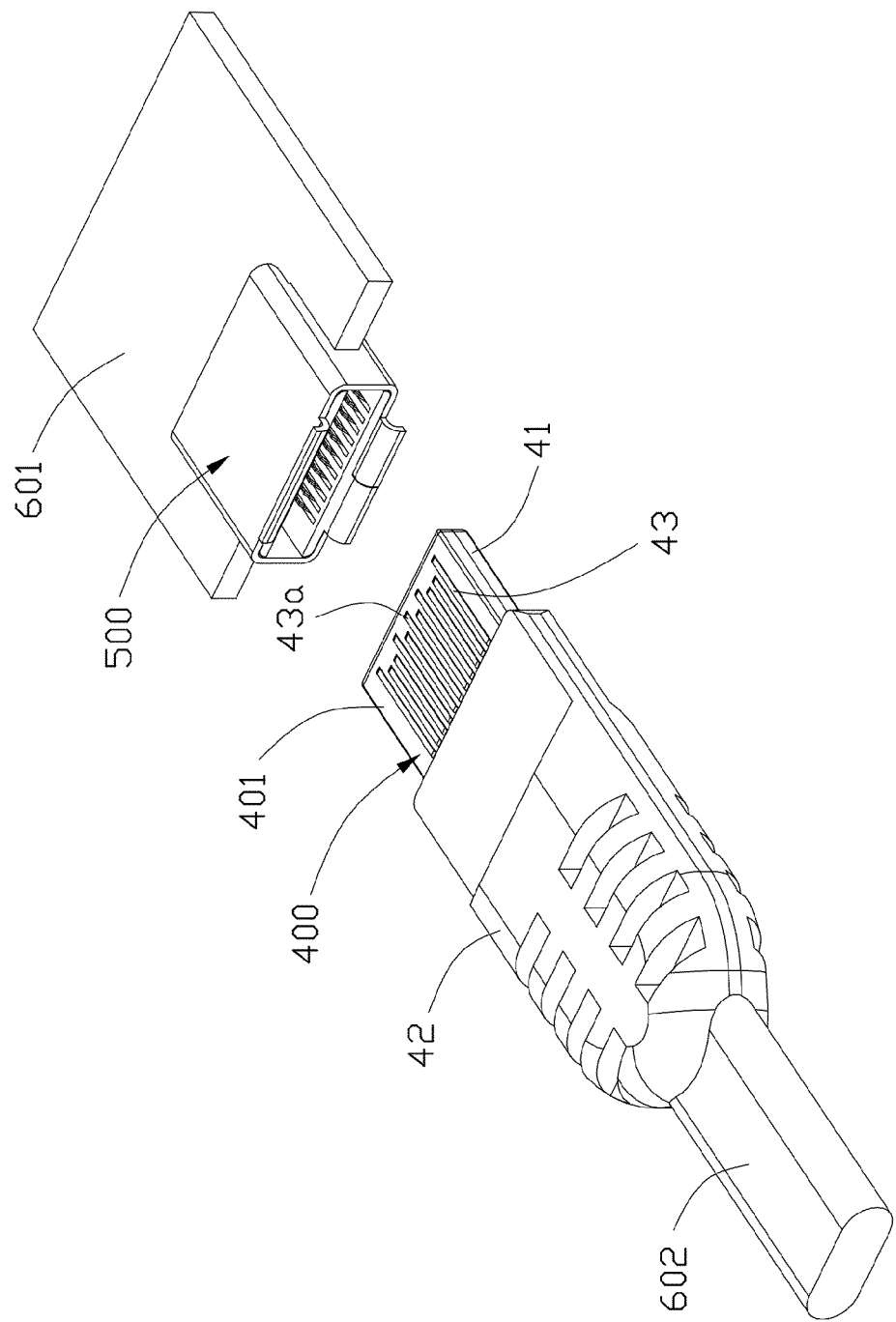
FIG. 13 is a front view of a plug connector of a third embodiment according to the present invention.
Figure 14:
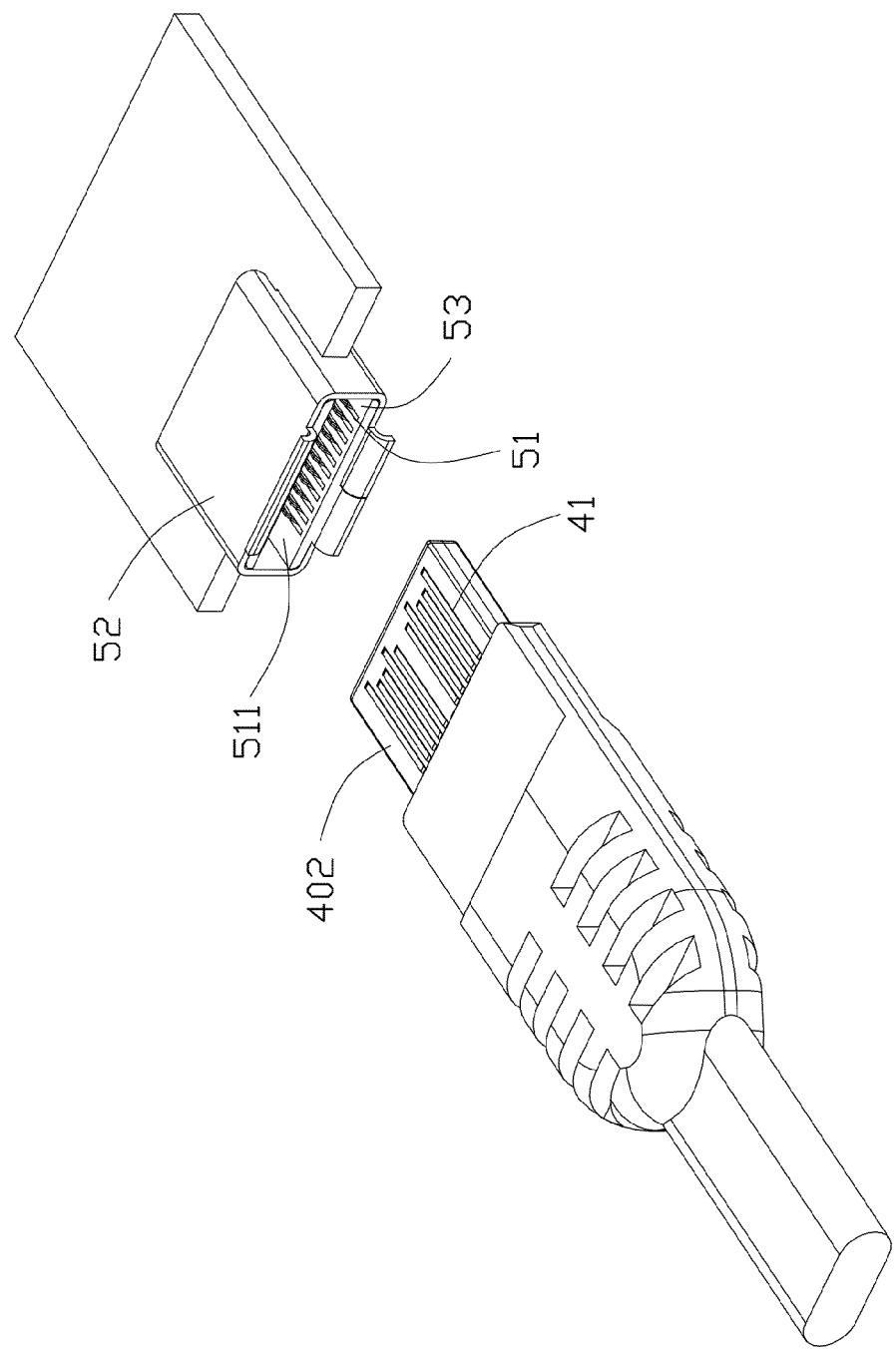
FIG. 14 is a front view of a receptacle connector designed to mate with the plug connector in FIG. 13.

Referring to FIGS. 13-15, an assembled of a plug connector 400 and a receptacle connector 400 mounted on an external printed circuit board 601, of a third embodiment is disclosed according to the instant invention. The plug connector 400 includes a mating tongue 41, being a paddle card made of an internal printed circuit board, defining opposite top surface 401 and bottom surface 402. An overmolded cover 42 encloses a rear part of the mating tongue 41, and a cable 602 extends rearwardly from a rear end of the overmolded cover 42. A plurality of conductive pads 43 are formed on the top surface 401 and on the bottom surface 402 and categorized with differential-pair pads, grounding pads, power(Vbus) pads, and signal pads in a same sequence as shown in FIG. 15, except that the top surface 401 is further equipped with a specific center CC or CC1 pad 43a while the bottom surface 402 is not. It is noted that the CC or CC1 pad 43a defines functions including multiple functionalities: (1) no new silicon needed for detecting device attached (either directly or through the cable) and triggering power on indication of OK to connect without VUSB power; (2) detecting device detached and triggering power off fast enough to defeat the user removal and insertion timing, e.g., <500 ms; (3) default operational role: Host, Device or Dual Tie-breaker mechanism for two dual-role devices. Understandably, another feature may extend to be the valid attach indicator. In brief, the basic functionality may be extended to the higher current mode for faster charge at 5V and >1.5 A while the extended functionality including PD messaging over CC standard USB PD specification, proprietary modes (e.g., for docking) required to still support some basic USB function, and failure contact information reporting mechanism.

The receptacle connector 500 includes an insulative housing 51 enclosed in a metallic shell 52. The housing defines a receiving cavity 511 for receiving the mating tongue 41. A plurality of contacts 53 are disposed in the housing 51 and arranged in opposite top row and bottom row by two sides of the receiving cavity 211 in the vertical direction (only the bottom row being shown). Notably, the characters/categories of the contacts 53 sequentially correspond to those of conductive pads 43. The difference between the arrangement of the conductive pads 43 and that of the contacts 53 is that the center contact CC of the contacts 53 in the top row and that in the bottom row both exist and connect to a same circuit on the printed circuit board so as to assure electrical connection with the specific center pad CC of the plug connector disregarding the insertion orientation of the mating tongue 41 of the plug connector 400. In addition, alternately the center contact CC in the top row and the center contact CC in the bottom row may be joined together to share a same tail mounted to the external printed circuit board.

Understandably, because the characters/categories of the conductive pads 43 on the top surface 401 and those on the bottom surface 402 of the plug connector 400 are arranged in the same sequence and because the center contact of the top row and that of the bottom row of the receptacle connector 500 are directed to the same operation circuit on the external printed circuit board, the plug connector 400 is flappable relative to the receptacle connector 500 for operation during mating even if the conductive pads 43 on the top surface 401 is not truly symmetrical with regard to those on the bottom surface 402 due to missing of the center pad CC on the bottom surface 402.

Figure 16:
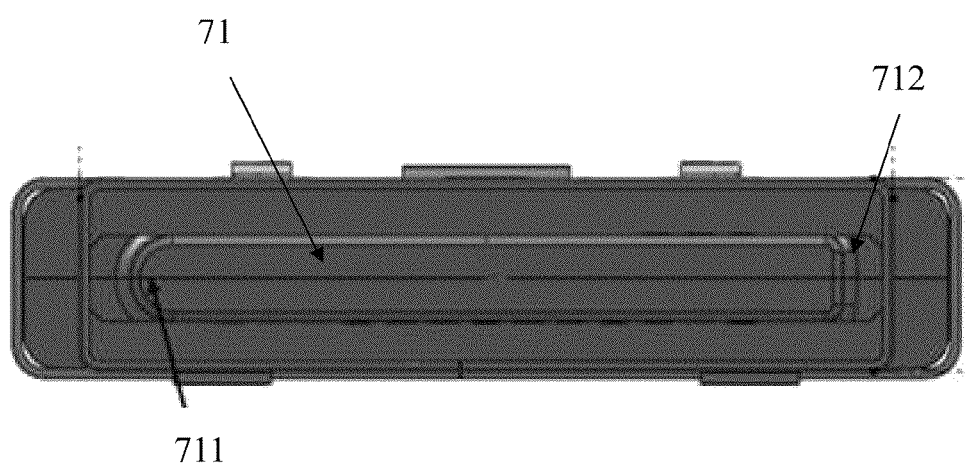
FIG. 16 is a perspective view of the plug connector with a second orientation opposite to the first orientation and the corresponding receptacle connector of FIG. 15.
Figure 17:
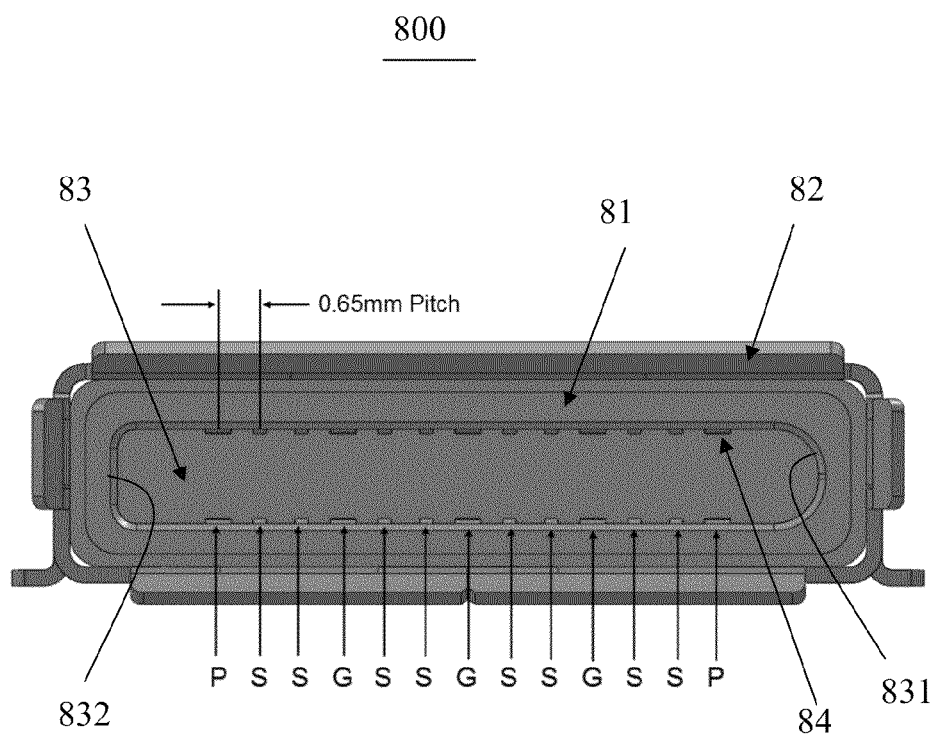
FIG. 17 is a table showing the pin assignments of the conductive pads on the top surface and the bottom surface of FIG. 15 and FIG. 16.

FIGS. 16 to 17 illustrate a forth embodiment of an electrical connector assembly according to this present invention. The electrical connector assembly includes a plug connector 700 which is mated with a receptacle connector 800. The tab 71 extends from a base in a longitudinal direction and extends in a lateral direction. The upper main surface and the lower main surface are symmetrical while the left end right side surfaces 711, 712 are different from each other. The left side surface 711 is arc and the right side surface 712 is linear. Therefore, the plug connector 700 has only one orientation when mating with the receptacle connector 800. The receptacle connector 8600 defines a mating frame 81 which is surrounded with a shielding shell 82. The shielding shell separated away from the outer periphery of the mating frame with a small gap. The mating frame 81 further defines a front mating cavity 83 opening forwards. The front mating cavity has an arc inner side 831 and a linear inner side 832 opposite from each other. Two rows of contacts 84 are disposed on opposite inner upper and lower surface of the mating cavity 83.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
a printed circuit board sandwiched between first and second housing units with opposite first and second surfaces facing said first housing unit and said second housing unit, respectively, a mating tab formed on front portions of said first and second housing units;
a first set of contacts disposed in the first housing unit with mating sections exposed upon one face of said mating tab and with connecting tails mounted to the first surface; and
a second set of contacts disposed in the second housing with mating sections exposed upon the other face of said mating tab and with connecting tails mounted to the second surface; wherein
said printed circuit board defines a pair of conductive layers sandwiching a pair grounding layers;
a frame behind the housing units to enclose an extension portion of the printed circuit board wherein said conductive layer and said grounding layers are located;
said pair of ground layers further sandwich a pair of V-Bus layers.

2. The electrical connector as claimed in claim 1, wherein the housing units are dimensioned to fully enclose the printed circuit board.

3. The electrical connector as claimed in claim 1, wherein the mating tab includes a front portion of the printed circuit board.

4. The electrical connector as claimed in claim 1, wherein said mating tab includes a metal plate embedded therein.

5. An electrical connector assembly comprising:
a plug connector defining a mating tongue with two opposite first and second surfaces thereon;
a plurality of first conductive pads formed on the first surface;
a plurality of second conductive pads formed on the second surface;
both said first conductive pads and said second conductive pads categorized with at least power pads, differential pads and grounding pads in a same sequence except that the first pads further include a specific center pad for several functions while the second pads lack said center pad but with a vacant space therein;
a frame enclosing the PCB where the ground layers are located;
wherein said pair of grounding layers further sandwich a pair of V-Bus layers ;
a receptacle connector for mounting to an external printed circuit board, defining a receiving cavity with opposite first and second rows of contacts by two sides of the receiving cavity in the vertical direction; wherein both the first row of contacts and those of the second row of contacts are categorized with at least power contacts, differential pair contacts and grounding contacts in said same sequence under condition that each row of said first row of contacts and said second row of contacts are equipped with a specific center contact corresponding to the specific center pad for multiple functions for allowing opposite orientations of the mating tongue of the plug connector during mating.

6. The electrical connector assembly as claimed in claim 5, wherein the first conductive pads and the second conductive pads are aligned with each other in a vertical direction perpendicular to said first and second surfaces.

7. The electrical connector assembly as claimed in claim 5, wherein the center contact in the first row of contacts and the center contact in the second row of contacts are joined with each other sharing a same tail for mounting to the external printed circuit board.

8. An electrical connector assembly comprising:
an upper insulative housing defining an upper face thereon;
a plurality of upper contacts disposed in the upper insulative housing, each of said upper contacts including a front contacting section and a rear tail section in a front-to-back direction;
a lower insulative housing defining a bottom face thereon;
a plurality of lower contacts disposed in the lower insulator housing, each of said lower contacts including a front contacting portion and a rear tail portion;
a printed circuit board sandwiched between the upper insulative housing and the lower insulative housing in a vertical direction perpendicular to said front-to-back direction, the contacting sections being exposed upon the upper face and the contacting portion being exposed upon the bottom face, the tail sections and the tail portions being electrically and mechanically connected to two opposite surfaces of a front region of the printed circuit board;

a metallic plate located between the upper insulative housing and the lower insulative housing in said vertical direction and in front of the printed circuit board in the front-to-back direction;

a frame enclosing the PCB where the ground layers are located;

said pair of ground layers further sandwich a pair of V-Bus layers.

9. The electrical connector assembly as claimed in claim 8, wherein said upper insulative housing defines a pair of lateral upper openings and the lower insulative housing defines a pair of lateral lower openings in alignment with the upper openings in the vertical direction, and the metallic plate defines a pair of protrusions extending laterally through the corresponding pair of upper and lower openings, respectively, and each of said protrusions defines a notch for locking.

* * * * *